(12) United States Patent
Akhmetov

(10) Patent No.: US 8,885,329 B2
(45) Date of Patent: Nov. 11, 2014

(54) SUPERCONDUCTING SWITCH COOLED BY MEANS OF INTERNAL CAVITY FILLED WITH LIQUID OR GASEOUS COOLANT

(75) Inventor: Alexander A. Akhmetov, Schenectady, NY (US)

(73) Assignee: Koninklijke Philips N.V., Eindhoven (NL)

( * ) Notice: Subject to any disclaimer, the term of this patent is extended or adjusted under 35 U.S.C. 154(b) by 557 days.

(21) Appl. No.: 13/141,090

(22) PCT Filed: Nov. 23, 2009

(86) PCT No.: PCT/IB2009/055290
§ 371 (c)(1),
(2), (4) Date: Jun. 21, 2011

(87) PCT Pub. No.: WO2010/073146
PCT Pub. Date: Jul. 1, 2010

(65) Prior Publication Data
US 2011/0253407 A1    Oct. 20, 2011

Related U.S. Application Data

(60) Provisional application No. 61/139,805, filed on Dec. 22, 2008.

(51) Int. Cl.
*H05K 7/20* (2006.01)
*H01L 39/20* (2006.01)
(52) U.S. Cl.
CPC .................................. *H01L 39/20* (2013.01)

USPC ...... 361/677; 361/679.53; 361/689; 361/691; 361/698; 361/699; 324/320; 335/216; 174/15.4; 174/15.5; 174/16.1

(58) Field of Classification Search
None
See application file for complete search history.

(56) References Cited

U.S. PATENT DOCUMENTS

| 5,394,130 | A |   | 2/1995 | Xu et al. |
|---|---|---|---|---|
| 5,633,588 | A | * | 5/1997 | Hommei et al. ............... 324/320 |
| 5,757,257 | A | * | 5/1998 | Doi et al. ....................... 335/216 |
| 2009/0267716 | A1 |  | 10/2009 | Tanaka et al. |

FOREIGN PATENT DOCUMENTS

| JP | 63239876 | 10/1988 |
|---|---|---|
| JP | 63081874 | 12/1988 |
| JP | 05160447 | 6/1993 |

* cited by examiner

*Primary Examiner* — Courtney Smith

(57) ABSTRACT

When testing or powering up a magnet in a magnetic resonance imaging device, a switch is provided that switches a winding between resistive and superconductive modes. The switch includes a housing that contains a winding wound about a bobbin, and an internal coolant cavity that contains coolant that cools the winding. A baffle separates the internal coolant cavity from an external coolant reservoir. The baffle has small apertures that permit influx of liquid coolant into the internal cavity to cool the winding. At high temperatures, the coolant in the internal cavity vaporizes causing the winding to further increase its temperature and resistance. Upon reduction of heat to the winding, the winding cools sufficiently to permit influx of liquid coolant, thereby restoring a superconductive mode of operation to the winding.

16 Claims, 3 Drawing Sheets

SUPERCONDUCTING SWITCH COOLED BY MEANS OF INTERNAL CAVITY FILLED WITH LIQUID OR GASEOUS COOLANT

CROSS REFERENCE TO RELATED APPLICATIONS

This application claims the benefit of U.S. provisional application serial no. 61/139,805 filed Dec.22, 2008, which is incorporated herein by reference.

The present innovation finds particular application in medical imaging systems, particularly involving magnetic resonance imaging (MRI) and the like. However, it will be appreciated that the described technique may also find application in other imaging systems, other device switch scenarios, other switching devices, and the like.

A superconducting switch is a device that is desired to remain safely superconducting in one mode of operation, while providing high electrical resistance in another (resistive) mode. One of the accepted solutions involves using of a superconducting material conjoined with a normal metal (e.g. copper, aluminum, bronze) component, typically in the form of a wire in a matrix of normal metal, to wind the switch; this type of composite is comparatively stable in the superconducting state during a controlled change of current flowing through the switch. On the other hand, the normal metal matrix current-carrying wire is susceptible to overheating while in the resistive mode; the resistance of the normal metal increases with temperature, thus providing a desirable high total resistance of the switch. In some configurations, this resistive mode may be used as part of the safety circuit to remove current from the magnet very quickly during a quench, thereby preventing damage to the magnet or to nearby people or equipment.

Demands on the switch thermal insulation are contradictory; on one hand, better cooling of the superconducting winding improves its stability against quench, especially during current ramp. On the other hand, good thermal insulation is needed in the resistive mode of operation of the switch to achieve overheating and, hence, high electrical resistance.

The present application provides new and improved systems and methods for managing the cooling conditions of a superconducting switch, which overcome the above-referenced problems and others.

In accordance with one aspect, a switch that switches between resistive and superconductive modes of operation includes a housing that contains a winding assembly comprising at least one winding, at least one heating element, and at least one optional bobbin around which a winding is positioned; at least one internal cooling cavity comprising a coolant that cools the at least one winding; an external coolant reservoir; and at least one baffle with one or more small apertures that permit intended coolant flux between the interior cooling cavity and the external coolant reservoir.

In accordance with another aspect, a method of manufacturing a dual mode switch for operation of a magnet in a magnetic resonance imaging (MRI) device includes winding at least one superconducting wire around a bobbin to form at least one winding there about. At least one heating element is included. The heating element might be any element to create heat as is known in the state of the art. In one embodiment, the winding assembly comprised the at least one winding, the at least one heating element, and the bobbin. In an alternative embodiment, some or all of the bobbin is discarded and the winding assembly comprises the at least one winding, the at least one heating element, and any residual portions of the bobbin. The method further comprises positioning the winding assembly in a substantially tubular housing. Said housing can have any geometrical cross-section. The method further includes affixing one or more baffles to at least one common end of the housing and the winding assembly. In one embodiment of the method, an optional connecting layer is affixed to at least one common end of the housing and the winding assembly. The optional connecting layer can seal the end of the internal cooling cavity. The optional connecting layer may replace at least one baffle. An internal coolant cavity is defined by a cooling surface of the winding and the winding assembly, an optional inner surface of the housing, and the at least one baffle. The one or more baffles include one or more small apertures that permit an intended flux of coolant between the internal coolant reservoir and the external coolant reservoir.

According to another aspect, a method of switching a switch between superconductive and resistive modes of operation includes heating at least one heating element in the switch to a temperature sufficient to revert at least part of one winding into the resistive state and to cause evaporation of a liquid coolant in the cooling cavity, wherein the evaporation of the coolant causes excess coolant to leave the cooling cavity through the one or more small apertures in the one or more baffles. As in known in the state of the art, the decrease in the density of coolant impedes heat removal from the winding to the external coolant reservoir, thereby maintaining an increased temperature. The increased temperature of the coolant maintains an increase in temperature and therefore resistivity of at least one portion of the winding in the winding assembly while in the resistive mode. The method further includes reducing power to the at least one heating element to permit the coolant in the cooling cavity to condense from a vapor state and refill with liquid coolant from the external coolant reservoir to cool the winding to a temperature in which it is superconductive, thereby returning to superconductive mode.

One advantage is that a dual mode switch is provided that operates in both resistive and superconducting mode.

Another advantage resides in improved stability in the superconducting mode.

Another advantage is an increase in the switch resistance in the resistive mode.

Still further advantages of the subject innovation will be appreciated by those of ordinary skill in the art upon reading and understand the following detailed description.

The innovation may take form in various components and arrangements of components, and in various steps and arrangements of steps. The drawings are only for purposes of illustrating various aspects and are not to be construed as limiting the invention.

Figure 1:
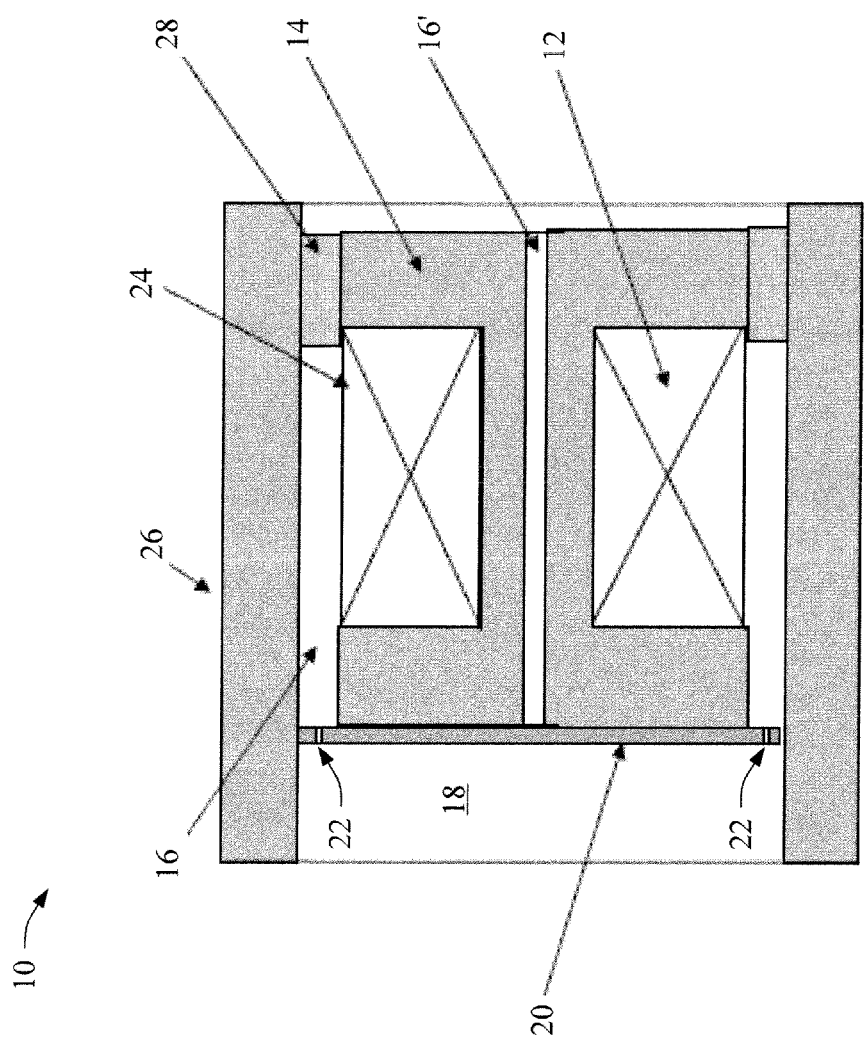
FIG. 1 illustrates a cross-section of a superconducting switch with the winding assembly consisting of windings, wound around an optional bobbin, from superconducting wire. The cooling cavity is located external to the winding assembly.

FIG. 1 illustrates a cross-section of a superconducting switch 10 with a winding assembly consisting of windings 12, wound around an optional bobbin 14, from superconducting wire and at least one heating element. The winding assembly is cooled via an internal cavity 16. The switch 10 employs a winding 12 on the spool or bobbin 14 with the hollow interior cavity 16. The hollow interior cavity is separated from an external coolant (e.g., liquid helium (He)) reservoir or volume 18 by a baffle 20 that has one or more small apertures 22. The maximum size of the apertures is commensurate in size with the bubble size of gaseous coolant in liquid coolant at the normal operating pressures of the superconducting magnet cooling system. If the preferred coolant is helium, the maximum size of the apertures would be on the order of 1 mm. In the superconducting state, the interior cavity is filled with liquid coolant (e.g., helium), which absorbs any heat generated. To cause the switch to go to the resistive state, the heating element is activated. To return to the superconductive state, at least the heating element is deactivated, allowing gaseous coolant in the bore to condense and to permit additional liquid coolant to flow into the bore from the external reservoir. The cooling from entirety of the liquid coolant in the interior cavity returns the winding to its superconducting state. More specifically, as liquid coolant starts cooling a cooling surface 24 of the winding and/or bobbin, the winding becomes less and less resistive, allowing the transition to the superconducting state to progress more rapidly.

In one embodiment, the internal cavity 16 is defined on one side by a housing 26 (e.g., an outer insulating tube) and on the other by the surface 24 of the winding assembly, as illustrated. The internal cavity is bounded at one end by the baffle 20, and at the other by an connecting layer 28, which couples the bobbin to the housing tube and seals one end of the inner cavity. In another embodiment, the internal cavity is bounded at all ends with baffles 20.

In another embodiment, the windings 12 of the switch 10 are wound from superconducting wire. The internal cooling cavity 16 is separated from the external volume 18 filled with liquid coolant by the baffle 20 or baffles that are pierced by the small apertures 22, allowing limited coolant flow, where both the total cross-sectional area of the small apertures and their relative distribution are determined by the desired coolant and the operating modes of the switch.

The cavity 16 is sized so that the heat generation in the switch during all operation modes of the MRI, while the switch is in the superconducting mode, is insufficient to evaporate the coolant in the cavity 16. In one embodiment, the lower limit of the size and number (cross-sectional area) of apertures is chosen to allow bubbles generated in the switch while it is in the superconducting state to escape while allowing continuous refill from the external volume. In another embodiment, the lower limit of the cross-sectional area of the apertures is so low that the bubbles generated during superconducting operation modes of the switch substantially do not escape. However, their volume is insignificant in comparison with the volume of the cavity 16 so that for most of the winding surface remains wetted with liquid coolant. At these low levels of heat generation, the coolant contained within the cavity 16 is in a substantially liquid state. These bubbles condense when the heat generation in the winding stops. The bubbles of the evaporated coolant are either insignificant in volume in comparison with the volume of the cavity 16, or are removed through the apertures 22 in the baffles. Therefore at least one surface of the winding assembly remains mostly wetted with liquid, which provides good cooling of the winding.

However, in the resistive mode of operation of the switch, the heat generation in the winding is sufficiently high that the majority of the coolant evaporates from the internal cavity 16, and the internal cavity is substantially filled with the gaseous coolant. In one embodiment, the upper limit of the size and number of apertures is selected to allow the gas generated during the resistive mode to escape while hampering refill from the external volume. The apertures 22 are sized and distributed to allow the escaping gas to substantially fill the aperture and minimize the liquid backflow into the internal cavity 16. As the result, the inner cooling surface 24 becomes substantially dry, which impedes cooling, enhances thermal insulation, and consequently increases temperature of the winding further; thereby causing desirable enhancement in the resistance of the winding. In another embodiment, the gas appeared in the internal cavity during switch operation condenses when the heat generation in the switch stops. The upper limit of the size and number of openings is selected such to allow refill of the inner cavity in a timely fashion. In FIG. 1, the internal cavity (volume) 16 is located around outer diameter of the winding assembly. Additionally an optional internal cavity 16' is located on the inner diameter of the superconducting switch windings 12, shown here inside the optional winding bobbin 14. As shown, the coolant is in the direct contact with the winding. In another embodiment, the coolant is not in direct contact with the winding. However, in this case, the winding assembly is designed such that the material between the winding and the coolant is designed so as to allow heat to transition through in a timely fashion.

In another embodiment, the switch is made resistive by applying heat to the switch to cause the normal zone to appear in the winding and to cause the liquid coolant (e.g., Helium) to evaporate. To cause the switch to return to a superconductive state, at least the heating element is turned off, causing the windings to cool, which permits liquid coolant from the external volume 18 to displace coolant gas in the internal cavity 16.

Although the internal cavity 16 is shown as one cavity and centered around the winding assembly, multiple cavities can be used, and their positions are only limited by the criteria that the material between the winding and the coolant is designed so as to allow heat to transition through in a timely fashion.

Figure 2:
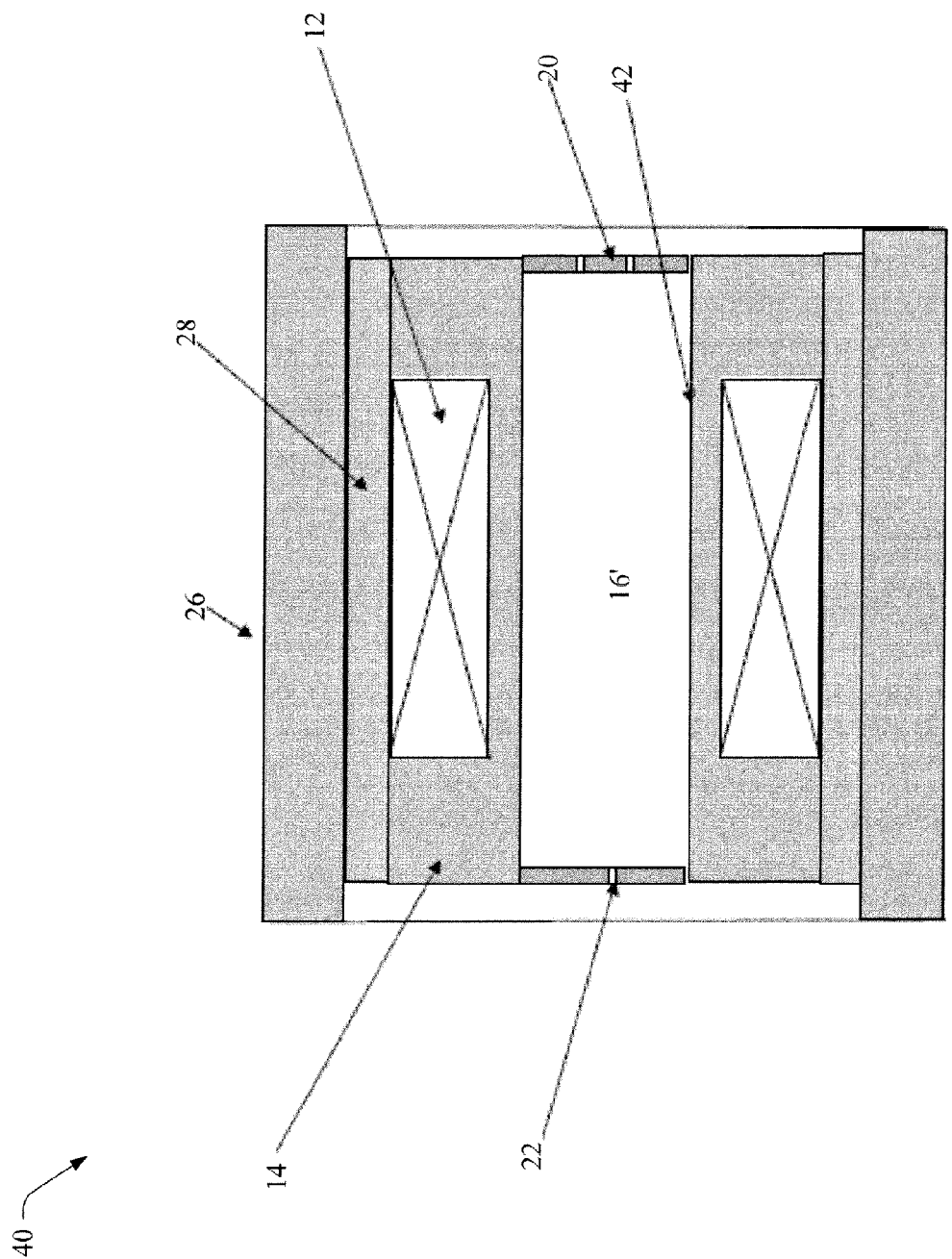
FIG. 2 illustrates a switch where the cooling cavity is located internal to the winding assembly.

FIG. 2 illustrates a switch 40 with the internal cavity 16' located on an inner diameter of the winding assembly, shown inside the optional winding bobbin 14. The winding assembly is designed such that the optional material between the winding and the coolant is designed so as to allow heat to transition through in a timely fashion. Coolant flows between the internal cavity 16' and an external reservoir 18, as described with regard to FIG. 1. The presence of the baffles 20 with small apertures 22 enables good cooling of a winding assembly cooling surface 42 at low heat generation and restricts cooling at high heat generation in the winding. The winding assembly is coupled to the housing 26 (e.g., an outer insulating tube or the like) by an optional connecting layer 28, or an additional baffle 20.

Although the internal cavity 16' is shown as one cavity and centered within the winding assembly, multiple cavities can be used, and their positions are only limited by the criteria that the material between the winding and the coolant is designed so as to allow heat to transition through in a timely fashion. Additionally, the cooling cavity can consist of a plurality of cavities comprising a combination of at least one internal cavity 16' as shown in FIG. 2 and at least one internal cavity 16 as shown in FIG. 1.

FIGS. 3A-3D illustrate various embodiments of the baffles 20 with the channels or apertures 22 made either as holes in the baffles or as the cuts at the perimeter of the baffles. Alternative shapes for the apertures, such as ovals, rectangles, slots, etc. are acceptable, so long as the size and number (total cross-sectional area) of the small apertures aligned with the internal cavity fall between the lower and upper limits as determined by the heat generation during the two operating modes. In case of very small capillary openings, the number and cross-section areas of them are determined by the desirable rate of bubble condensation after heat generation stops.

Figure 3A:
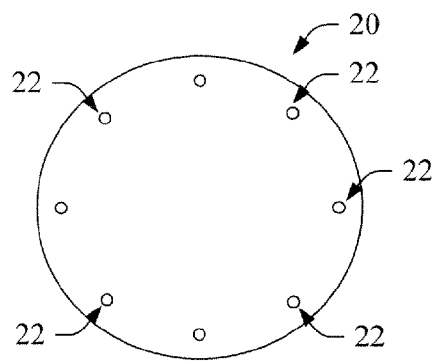
FIGS. 3A-3C illustrate various embodiments of the baffles with the channels or apertures made either as holes in the baffles or as the cuts at the perimeter of the baffles.

FIG. 3A illustrates an embodiment in which the small apertures 22 are cut as notches in the perimeter of the baffle 20.

Figure 3B:
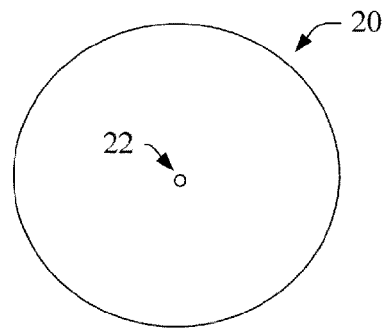

FIG. 3B illustrates an embodiment in which the small apertures 22 are provided near the perimeter of the baffle 20.

Figure 3C:
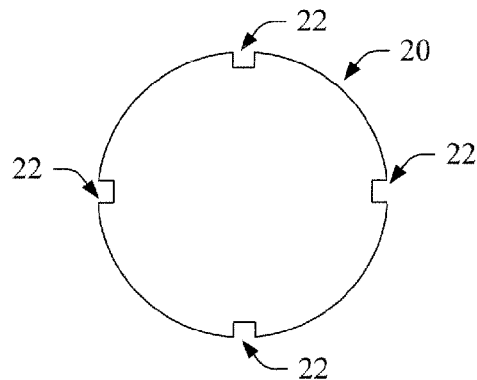

FIG. 3C illustrates an embodiment in which a single small aperture 22 is provided at the center of the baffle.

Figure 3D:
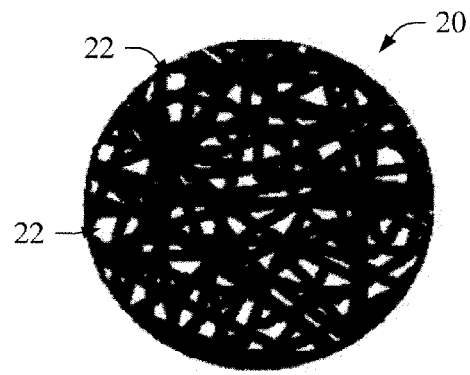
FIG. 3D shows an alternative embodiment where the channels or apertures are the naturally occurring openings in a baffle made of felt, stiff cloth, mesh or comparable material as known in the state of the art.

FIG. 3D illustrates an embodiment in which small apertures 22 appear naturally in the baffle 20 made of felt, stiff cloth, mesh, expanded metal, foam, or any comparable gas-permeable material as known in the state of the art.

It will be appreciated that the baffle 20, as well as the switch 10, are not limited to a circular cross-section, but rather may have any suitable or desired shape, as will be understood by those of skill in the art.

The innovation has been described with reference to several embodiments. Modifications and alterations may occur to others upon reading and understanding the preceding detailed description. It is intended that the innovation be construed as including all such modifications and alterations insofar as they come within the scope of the appended claims or the equivalents thereof.

The invention claimed is:

1. A switch that switches between resistive and superconductive modes of operation, the switch comprising:
    a housing that contains a bobbin around which a winding is positioned;
    an internal cooling cavity comprising a coolant that cools at the winding assembly, which comprises the winding and the bobbin;
    an external coolant reservoir; and
    a baffle with one or more small apertures that permit coolant flux between the interior cooling cavity and the external coolant reservoir,
    wherein the internal coolant cavity forms a substantially annular ring between an interior surface of the housing and a cooling surface of at least one of the winding and the bobbin, and is delineated at a first end by an affixed sealed layer that couples the housing to the bobbin and at a second end by the baffle affixed to the second end.

2. The switch according to claim 1, wherein the one or more small apertures have a diameter of approximately 0.1 mm to approximately 1 mm.

3. The switch according to claim 1, wherein the one or more small apertures is commensurate in size with the bubble size of gaseous coolant in liquid coolant at the normal operating pressures of the superconducting magnet cooling system.

4. The switch according to claim 1, further comprising:
    a heater that is coupled to the switch, wherein current is applied to the heater to cause the winding to heat and cause the coolant to evaporate in the internal coolant cavity, thereby causing the switch to leave superconducting mode and enter resistive mode.

5. The switch according to claim 1, wherein at least one of a voltage and a current supplied to the switch and a heater are reduced to cause the coolant in the internal coolant cavity to condense into a liquid state concurrently with the refill of the cavity by the liquid coolant from the external reservoir, thereby causing the switch to leave resistive mode and enter superconductive mode.

6. The switch according to claim 1, employed in a magnetic imaging device to cause at least one magnet therein to charge or discharge.

7. The switch according to claim 1, wherein the baffle is formed of a woven material and the small apertures are defined by spaces between woven fibers in the woven material.

8. A method of manufacturing a dual mode switch for operating a magnet in a magnetic resonance imaging (MRI) device, the method comprising acts of:
    winding a superconducting wire in a normal metal matrix around a bobbin to form a winding there about;
    positioning the bobbin and winding in a tubular housing;
    affixing at least a portion of an external surface of at least one of the bobbin and the winding to the housing with a connecting layer; and
    affixing baffles to both common ends of the housing and the bobbin,
    wherein an internal coolant cavity is defined by a cooling surface of the winding and bobbin, an inner surface of the housing, the connecting layer, and the baffle,
    wherein the baffle includes one or more small or capillary apertures that permit a flux of coolant between the internal coolant reservoir and an external coolant reservoir, and
    wherein the internal coolant cavity is defined by a cooling surface of the winding and bobbin, an inner surface of the housing, and the baffles.

9. The method according to claim 8, further comprising an act of:
    forming the one or more small apertures to have a diameter of approximately twice the average diameter of bubbles formed by the coolant when in a gaseous state in liquid coolant.

10. The method according to claim 8, further comprising an act of:
    forming the one or more apertures to have a diameter of approximately 0.4 mm.

11. The method according to claim 8, further comprising an act of:
    mounting the switch in a dewar of a superconducting magnet.

12. A method of switching a switch between superconductive and resistive modes of operation, the method comprising acts of:
    switching the switch to a resistive mode by heating a winding in the switch to a temperature sufficient to cause evaporation of a liquid coolant that cools the winding, wherein the evaporation of the coolant causes increased temperature and resistivity in the winding; and
    switching the switch to a superconductive mode by reducing power that is at least one of delivered to the winding and generated in the winding, to permit the coolant to condense from a vapor state while concurrently refilling an internal coolant cavity with liquid coolant from an external reservoir, wherein reducing power to the winding permits liquid coolant to flow through apertures in a baffle from the external coolant reservoir into the internal coolant reservoir, which is adjacent to and defined on one side by the winding.

13. The method according to claim 12, wherein the apertures have a diameter of approximately 0.1 mm to approximately 1.0 mm.

14. A switch that switches between resistive and superconductive modes of operation, including:
    a housing that contains a bobbin around which a winding is positioned;

an internal cooling cavity comprising a coolant that cools at the winding assembly, which comprises the winding and the bobbin;

an external coolant reservoir;

a first baffle with one or more small apertures that permit coolant flux between the interior cooling cavity and the external coolant reservoir; and a second baffle, wherein the internal coolant cavity forms an annular ring between an interior surface of the housing and a cooling surface of at least one of the winding and the bobbin, and is delineated at a first end by the first baffle affixed to the first end and at a second end by the second baffle affixed to the second end.

15. A switch that switches between resistive and superconductive modes of operation, including:

a housing that contains a bobbin around which a winding is positioned;

an internal cooling cavity comprising a coolant that cools at the winding assembly, which comprises the winding and the bobbin;

an external coolant reservoir; and a baffle with one or more small apertures that permit coolant flux between the interior cooling cavity and the external coolant reservoir, wherein the baffle is formed of a woven material and the small apertures are defined by spaces between woven fibers in the woven material.

16. A method of manufacturing a dual mode switch for operating a magnet in a magnetic resonance imaging (MRI) device, including:

winding a superconducting wire in a normal metal matrix around a bobbin to form a winding there about;

positioning the bobbin and winding in a tubular housing;

affixing at least a portion of an external surface of at least one of the bobbin and the winding to the housing with a connecting layer;

affixing a baffle to a first common end of the housing and the bobbin; and affixing a sealed layer to a second common end of the housing and the bobbin, wherein an internal coolant cavity is defined by a cooling surface of the winding and bobbin, an inner surface of the housing, the connecting layer, and the baffle, wherein the baffle includes one or more small or capillary apertures that permit a flux of coolant between the internal coolant reservoir and an external coolant reservoir, and wherein the internal coolant cavity is defined by a cooling surface of the winding and bobbin, an inner surface of the housing, the baffle and the sealed layer.

* * * * *